(12) United States Patent
Cideciyan et al.

(10) Patent No.: US 6,812,867 B2
(45) Date of Patent: Nov. 2, 2004

(54) DATA CODING FOR DATA STORAGE SYSTEMS

(75) Inventors: Roy D Cideciyan, Rueschlikon (CH); Ajay Dholakia, Gattikon (CH); Evangelos S Eleftheriou, Zurich (CH); Richard L Galbraith, Rochester, MN (US); Thomas Mittelholzer, Zurich (CH); Travis R Oenning, Rochester, MN (US); David J Stanek, Rochester, MN (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/455,696

(22) Filed: Jun. 5, 2003

(65) Prior Publication Data

US 2003/0227397 A1 Dec. 11, 2003

(30) Foreign Application Priority Data

Jun. 7, 2002 (EP) .............................................. 02012676

(51) Int. Cl.$^7$ ................................................ H03M 7/00
(52) U.S. Cl. ........................................ 341/59; 714/800
(58) Field of Search ............................ 341/59, 58, 50, 341/68; 714/800, 801, 795, 794

(56) References Cited

U.S. PATENT DOCUMENTS

| | | | | |
|---|---|---|---|---|
| 4,567,464 A | * | 1/1986 | Siegel et al. ................... | 341/59 |
| 4,870,414 A | * | 9/1989 | Karabed et al. ............... | 341/59 |
| 5,859,601 A | * | 1/1999 | Moon et al. ................... | 341/59 |
| 6,195,025 B1 | * | 2/2001 | Hassner et al. ............... | 341/59 |
| 6,229,458 B1 | * | 5/2001 | Altekar et al. ................ | 341/59 |
| 6,587,059 B2 | * | 7/2003 | Rezzi et al. .................. | 341/68 |
| 6,631,490 B2 | * | 10/2003 | Shimoda ..................... | 714/755 |
| 6,643,814 B1 | * | 11/2003 | Cideciyan et al. .......... | 714/755 |

* cited by examiner

*Primary Examiner*—Peguy JeanPierre
(74) *Attorney, Agent, or Firm*—Richard M. Goldman; Daniel E. Johnson; Mark C. McCabe

(57) ABSTRACT

Described is a modulation encoder having a finite state machine for converting input bits into output bits in which the number of alternating output bits is limited to j+1 where j is a predefined maximum number of transitions in the output bits, and in which the number of like output bits is limited to k+1 where k is a predefined maximum number of non-transitions in the output bits. The modulation encoder may be employed in encoding apparatus for converting an input bit stream into an output bit stream. Such apparatus may comprise partitioning logic for partitioning the input bit stream into a first group of bits and a second group of bits. A plurality of the aforementioned modulation encoders may be connected to the partitioning logic for converting the first group of bits into coded output bits. Combining logic may be connected to the or each modulation encoder and the partitioning logic for combining the coded output bits and the second group of bits to generate the output bit stream. Counterpart modulation decoders and decoding apparatus are also described.

7 Claims, 12 Drawing Sheets

DATA CODING FOR DATA STORAGE SYSTEMS

TECHNICAL FIELD

The present invention generally relates to data coding for data storage systems and particularly relates to data encoding and decoding methods and apparatus for data storage systems.

BACKGROUND OF THE INVENTION

There is an increasing demand at least in the field of magnetic recording and optical recording systems for inner codes that constrain channel input sequences so that they have certain desired properties for timing recovery, gain control, and, in some applications, for limiting path memory requirements of Viterbi detectors. For example, conventional peak detection systems typically employ run length limited (RLL) (d,k) constrained codes. These codes are normally found in optical recording systems and in relatively low linear-density magnetic recording systems. At moderate linear densities, the introduction of Partial Response Maximum Likelihood (PRML) detection to hard disk drive data storage devices involved the use of a different class of constrained codes known as (G,I) codes. As demonstrated by J. Moon and B. Brickner, "Maximum transition run codes for data storage systems," IEEE Trans. Magn., vol. 32, pp. 3992–3994, September 1996 and R. D. Cideciyan, E. Eleftheriou, B. Marcus, and D. Modha "Maximum Transition Run Codes for Generalized Partial-Response Channels" *IEEE J. Select. Areas Commun.*, 19(4), pp. 619–634, April 2001, maximum transition run (MTR) (j,k) codes have been introduced to provide run length limited properties and to enhance the detector performance. A 16/17 code combining an 8 bit unconstrained code with a nine bit (G,I) constrained byte is described in both J. Sonntag, "Apparatus and method for increasing density of run length limited block codes without increasing error propagation," U.S. Pat. No. 5,604, 497 and Coker, above. A $1/(1+D^2)$ precoder is also employed in Sonntag, above, and J. Coker, D. Flynn, R. Galbraith, T. Truax, "Method and apparatus for implementing a set rate code for data channels with alternate 9-bit code words and 8-bit code words," U.S. Pat. No. 5,784,010. High rate codes produced by interspersing MTR code words with uncoded source symbols are described in A. Wijngaarden, E. Soljanin, "A combinatorial technique for constructing high-rate MTR-RLL codes," *IEEE J. Select. Areas Commun.*, 19(4), pp. 582–588, April 2001. A 1(1+D) precoder is employed in A. Wijngaarden, above. All of the aforementioned codes are designed on the basis of a precoder being present at the output of the constrained code encoder. At the receiver side, the precoder operation is undone by an inverse precoder circuit. However, the inverse precoder causes error propagation that adversely affects the performance. For example, the inverse precoder can cause an increase in sector error rate of the outer Reed-Solomon (RS) code. In applications such as magnetic recording, the code rate is subject to a stringent requirement.

SUMMARY OF THE INVENTION

In accordance with the present invention, there is now provided a modulation encoder having a finite state machine for converting input bits into output bits in which the number of alternating output bits is limited to j+1 where j is a predefined maximum number of transitions in the output bits, and in which the number of like output bits is limited to k+1 where k is a predefined maximum number of non-transitions in the output bits.

Viewing the present invention from a different aspect, there is now provided, a modulation encoder having a finite state machine for converting input bits into output bits in which the number of like output bits is at least d+1 and at most k+1 where d is a predefined minimum number of non-transitions in the output bits and k is a predefined maximum number of non-transitions in the output bits.

In a preferred embodiment of the present invention, there is provided encoding apparatus for converting an input bit stream into an output bit stream, the apparatus comprising: partitioning logic for partitioning the input bit stream into a first group of bits and a second group of bits; at least one modulation encoder of one of the forms herein before described connected to the partitioning logic for converting the first group of bits into coded output bits; and, combining logic connected to the or each modulation encoder and the partitioning logic for combining the coded output bits and the second group of bits to generate the output bit stream. The encoding apparatus may comprise a plurality of modulation encoders as herein before described each for converting a different subgroup of the first group of bits into coded output bits, wherein the different subgroups of the first group of bits are interleaved with different subgroups of the second group of bits. The apparatus may additionally or alternatively comprise a parity generator connected to the or each modulation encoder and the partitioning logic for generating a parity code in dependence on the second group of bits and the coded output bits. The combining logic preferably comprises a parallel to serial convertor connected to the or each modulation encoder and the partitioning logic.

Viewing the present invention from another aspect, there is now provided a modulation decoder having a sliding block decoder logic for recovering output bits from input bits in which the number of alternating input bits is limited to j+1 where j is a predefined maximum number of transitions in the input bits, and in which the number of like input bits is limited to k+1 where k is a predefined maximum number of non-transitions in the input bits.

Viewing the present invention from yet another aspect, there is now provided a modulation decoder having sliding block decoder logic for recovering output bits from input bits in which the number of like input bits is at least d+1 and at most k+1 where d is a predefined minimum number of non-transitions in the input bits and k is a predefined maximum number of non-transitions in the input bits.

In another preferred embodiment of the present invention, there is provided decoding apparatus for decoding an input bit stream into an output bit stream, the apparatus comprising: partitioning logic for partitioning the input stream into a first group of bits and a second group of bits; at least one modulation decoder of one of the forms herein before described connected to the partitioning logic for decoding the first group of bits into decoded output bits; and, combining logic connected to the or each modulation decoder and the partitioning logic for combining the second group of bits and the decoded output bits. Such apparatus may comprise a plurality of modulation decoders as herein before described each for converting a different subgroup of the first group of bits into decoded output bits, wherein the different subgroups of the first group of bits are interleaved with different subgroups of the second group of bits. The partitioning logic of the decoding apparatus may comprise a serial to parallel convertor connected to the or each modulation decoder.

It will be appreciated that the present invention extends to a signal processing device comprising encoding apparatus and decoding apparatus as herein before described. Similarly, it will be appreciated that the present invention extends to a data storage device comprising a data storage channel, together with encoding apparatus and encoding apparatus as herein before described.

Viewing the present invention from yet another aspect, there is provided a bit encoding method comprising, via a finite state machine, converting input bits into output bits in which the number of alternating output bits is limited to j+1 where j is a predefined maximum number of transitions in the output bits, and in which the number of like output bits is limited to k+1 where k is a predefined maximum number of non-transitions in the output bits.

In accordance with the present invention, there is also provided a bit encoding method comprising, via a finite state machine, converting input bits into output bits in which the number of like output bits is at least d+1 and at most k+1 where d is a predefined minimum number of non-transitions in the output bits and k is a predefined maximum number of non-transitions in the output bits.

In yet another preferred embodiment of the present invention, there is provided a data encoding method for converting an input bit stream into an output bit stream, the method comprising: partitioning the input bit stream into a first group of bits and a second group of bits; converting the first group of bits into coded output bits according to one of the bit encoding methods herein before described; and, combining the coded output bits and the second group of bits to generate the output bit stream.

Viewing the present invention from a further aspect, there is now provided a bit decoding method comprising, via sliding block decoder logic, recovering output bits from input bits in which the number of alternating input bits is limited to j+1 where j is a predefined maximum number of transitions in the input bits, and in which the number of like input bits is limited to k+1 where k is a predefined maximum number of non-transitions in the input bits.

In accordance with the present invention, there is further provided a bit decoding method comprising, via sliding block decoder logic, recovering output bits from input bits in which the number of like input bits is at least d+1 and at most k+1 where d is a predefined minimum number of non-transitions in the input bits and k is a predefined maximum number of non-transitions in the input bits.

In a further preferred embodiment of the present invention, there is now provided a data decoding method for decoding an input bit stream into an output bit stream, the method comprising: partitioning logic for partitioning the input bit stream into a first group of bits and a second group of bits; decoding the first group of bits into decoded output bits via one of the bit decoding methods herein before described; and, combining the second group of bits and the decoded output bits.

In a preferred embodiment of the present invention to be described in detail shortly, byte-oriented (m-bit bytes) precoderless constrained codes are provided. In a particularly preferred embodiment of the present invention, these codes are conveniently combined with multiparity block codes to provide a further enhancement of system performance. In an especially preferred embodiment of the present invention, a very high rate precoderless inner code is provided by concatenating unconstrained bits with constrained n-bit bytes. The constrained n-bit bytes are obtained by encoding unconstrained m-bit bytes (n>m). In applications using outer RS codes, the m-bit bytes can be matched to the symbol size of the RS code to minimize error propagation. Preferred embodiments of the present invention include: apparatus and methods for providing rate 96/102 codes with two 8/9 (G,I) constrained bytes and four parity bits; apparatus and methods for providing rate 96/100 codes with two 8/9 MTR (j=1,2,3)) constrained bytes and 2 parity bits; apparatus and methods for providing rate 96/102 codes with three 8/9 MTR (j=1,2,3)) constrained bytes and 3 parity bits; and, apparatus and methods for providing rate 96/102 codes with two 8/9 MTR (j=2,3)) constrained bytes and 4 parity bits.

THE FIGURES

Preferred embodiments of the present invention are illustrated in the Figures appended hereto which:

DETAILED DESCRIPTION

Figure 1:
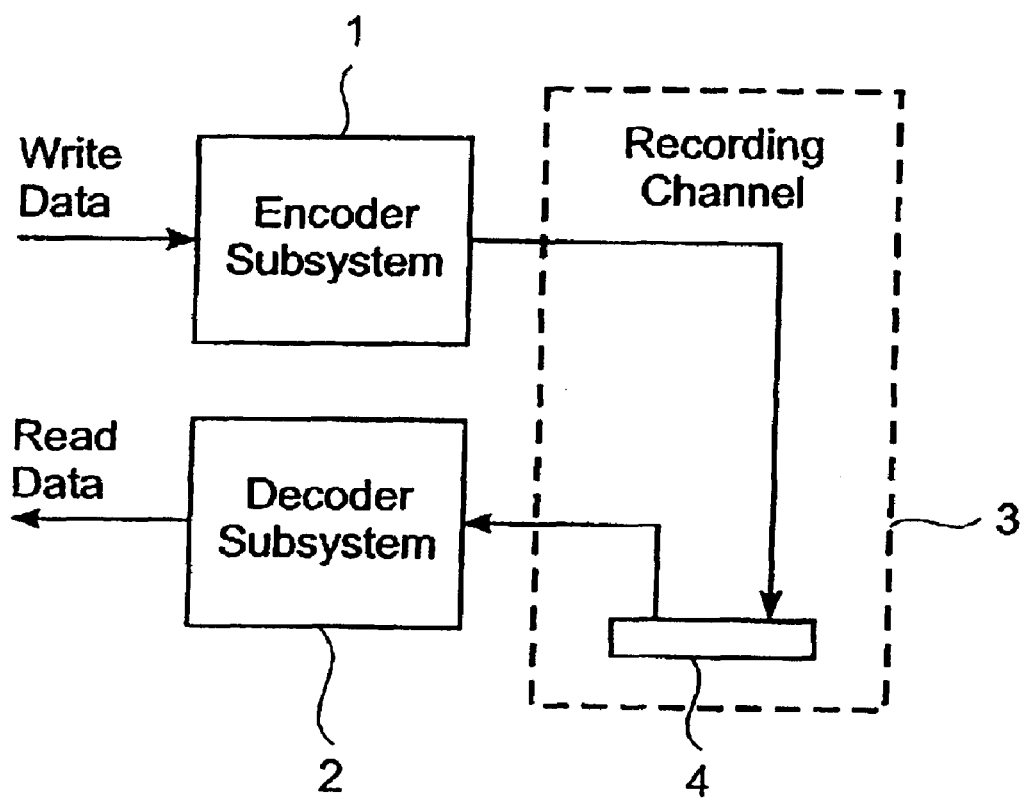
FIG. 1 is a block diagram of data storage system.

Referring first to FIG. 1, a data storage system comprises an encoder subsystem 1 for encoding write data to be written onto a storage medium 4 of a recording channel 3 and a decoder subsystem 2 for decoding signal detected from the recording channel 3 to produce read data. The storage medium 4 may be in the form of a magnetic disk, optical disk, or the like. The encoder subsystem 1 and decoder subsystem 2 may be integrated into a single application specific integrated circuit.

Figure 2:
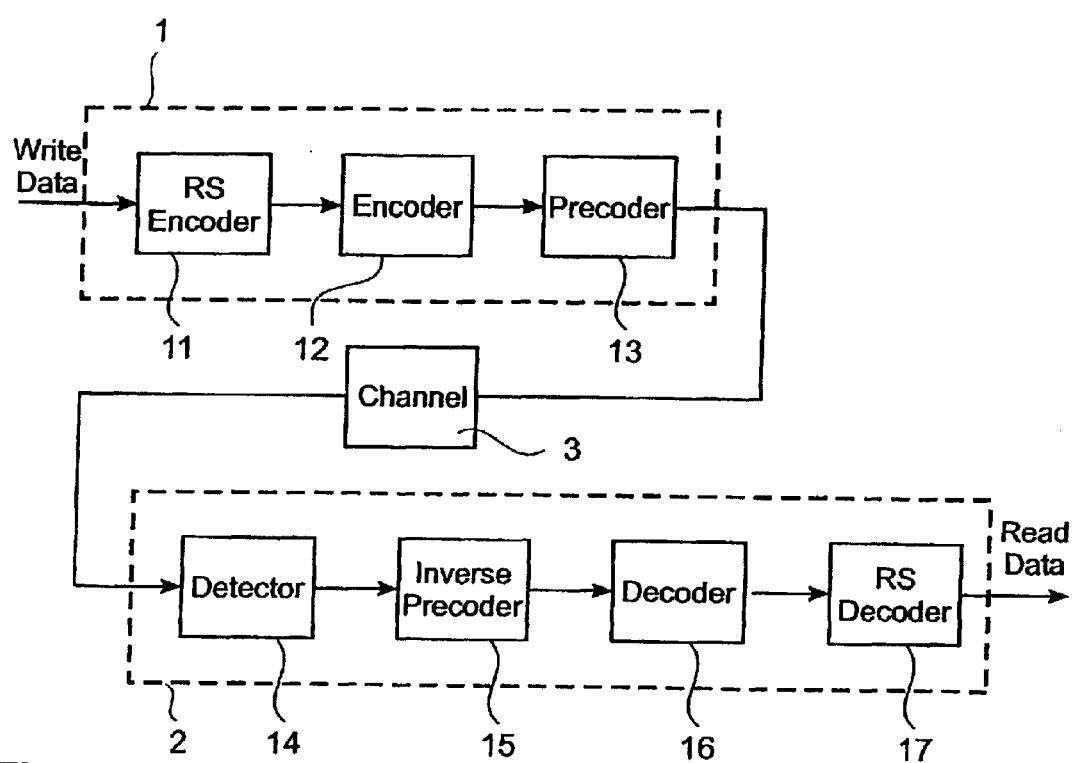
FIG. 2 is a block diagram of a conventional data storage system.

With reference to FIG. 2, in a conventional data storage system, the encoder subsystem 1 comprises a Reed Solomon (RS) encoder 11, a modulation encoder 12, and a precoder 13. Similarly, the decoder subsystem 2 comprises a detector 14, an inverse precoder 15, a channel decoder 16, and an RS decoder 17. In operation, the RS encoder 11 converts an incoming user bit stream into a sequence of symbols such as 8 bit bytes. The channel encoder 12 is based on a logic state machine. In use, the modulation encoder 12 converts incoming bits into output encoded bits according to a transition-based translation. The precoder 13 converts the transitions in the output of the modulation encoder 12 into levels suitable for recording in the recording channel 3. In the decoder subsystem 2, the detector 14 recovers the levels from the recording channel 3. The inverse precoder 15 converts the levels back into logic transitions. The logic transitions are then decoded by the modulation decoder 16 to provide the symbols. The symbols are converted into an output user bit stream by the RS decoder 17.

As indicated in [2], the following three classes of modulation codes are conventionally employed in optical and magnetic recording:
1) (d,k) codes in association with $1/(1\oplus D)$ precoders;
2) (G,I) codes in association with $1/(1\oplus D^2)$ precoders; and,
3) MTR (j,k) codes in association with $1/(1\oplus D)$ precoders.

In conventional coding systems, these codes, when combined with an appropriate precoder, impose constraints on binary channel input sequences. Specifically, after precoding, the d-constraint limits the minimum length of like binary symbols at the channel input to d+1. Similarly, after preceding, the k-constraint limits the maximum length of like binary symbols at the channel input to k+1. Likewise, after preceding, the G-constraint limits the maximum length of like and alternating binary symbols at the channel input to G+2. In addition, after precoding, the I-constraint limits the maximum length of like binary symbols in the odd and even interleave of channel input sequences to I+1. In a similar fashion, after preceding, the j-constraint limits the maximum length of alternating binary symbols at the channel input to j+1.

Figure 3:
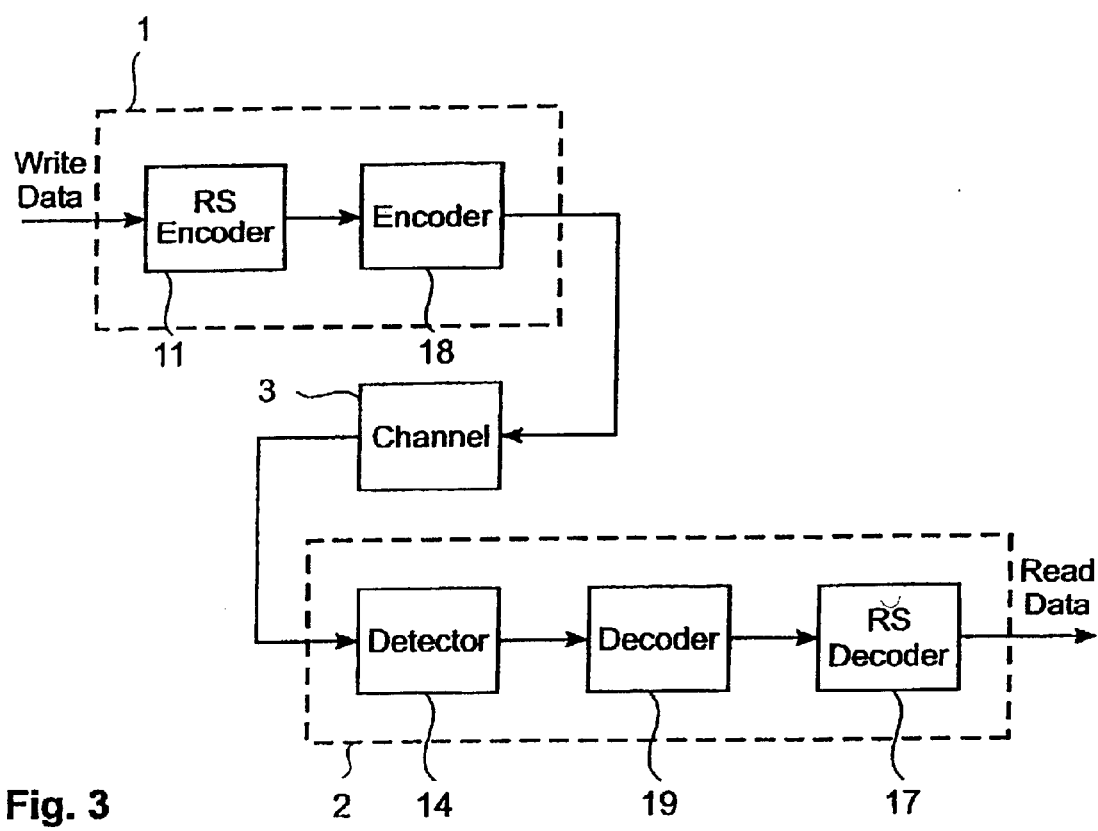
FIG. 3 is a block diagram of a data storage system embodying the present invention.

Referring now to FIG. 3, in a preferred embodiment of the present invention, the encoder subsystem 1 comprises a modulation encoder 18 having a finite state machine adapted to convert the incoming RS encoded symbols into output levels according to a level based translation. The need for a precoder is thus eliminated. Similarly, in the decoder subsystem 2, the need for an inverse precoder is eliminated by a channel decoder 19 comprising sliding block decoder logic adapted to convert outputs into the symbols via a level based translation.

The codes described herein in the interests of exemplifying the present invention avoid the use of any preceding operation. Therefore, there is no need to use a precoder in the encoder subsystem 1. Similarly, there is no need to use an inverse precoder in the decoder subsystem 2. The absence of an inverse precoder in particular is desirable in the interests of reducing error propagation, thereby leading to, for example, improved soft error rates at the input of the RS decoder 17.

Particularly preferred embodiments of the invention include: encoders and decoders for a rate-96/100 MTR (j=1,2,3)/uncoded dual-parity code; encoders and decoders for a rate-96/102 MTR (j=1,2,3)/uncoded triple-parity code; and, encoders and decoders for a rate-96/102 MTR (j=2,3)/uncoded quadruple-parity code. Each of these codes are based on rate-8/9 precoderless MTR mother codes. Preferred embodiments of the present invention based on a rate-8/9 MTR (j=1,2,3) mother code and a rate-8/9 MTR (j=2,3) mother code are described and corresponding code tables are provided. In addition, examples of an encoder and a decoder of a precoderless rate-96/102 (G=4, I=6)/uncoded quadruple-parity code are described.

The rate-8/9 MTR (j=1,2,3) code is specified in Table 1 appended hereto. This code imposes the following time-varying constraints on maximum length of transition runs:
1) j=1 at the end of the second bit
2) j=2 at the end of the third bit
3) j=3 at the end of the fourth bit
4) j=2 at the end of the fifth bit
5) j=3 at the end of the sixth bit
6) j=2 at the end of the seventh bit
7) j=3 at the end of the eighth bit
8) j=2 at the end of the ninth bit This code also satisfies the k=12 constraint and the $t_c=7$ twins constraint referred to in [2].

The rate-8/9 MTR (j=2,3) code is specified in Table 2 appended hereto. This code imposes the following slightly weaker time-varying constraints on maximum length of transition runs:
1) j=2 at the end of the third bit
2) j=3 at the end of the fourth bit
3) j=2 at the end of the fifth bit
4) j=3 at the end of the sixth bit
5) j=2 at the end of the seventh bit
6) j=3 at the end of the eighth bit
7) j=2 at the end of the ninth bit This code also satisfies the k=9 constraint and the $t_u=6$ twins constraint referred to in [2].

Figure 4:
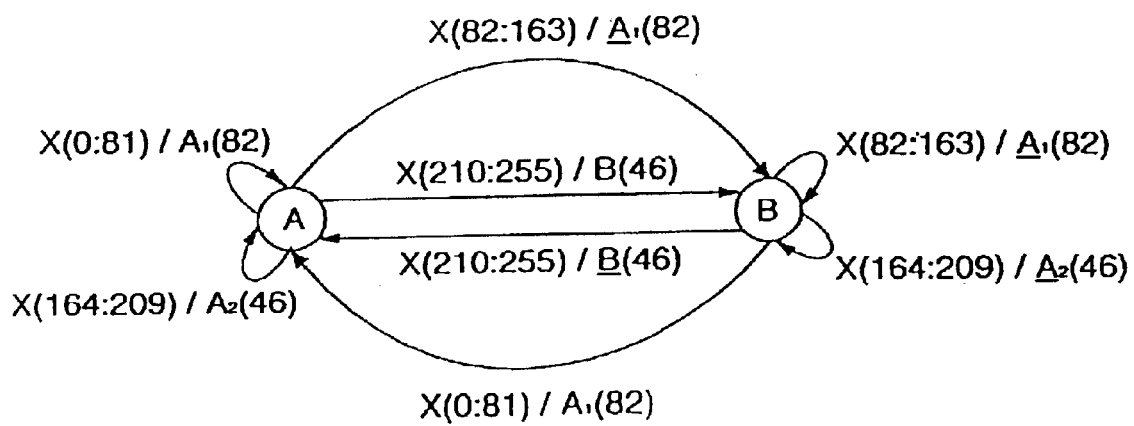
FIG. 4 is a block diagram, in the form of a finite-state machine, of an encoder for a rate-8/9 MTR (j=1,2,3) code.

Referring to FIG. 4, depicted therein is a representation of an example of a finite state machine of a modulation encoder 18 embodying the present invention for the rate-8/9 MTR (j=1,2,3) code. State A corresponds to the case in which the last bit of the preceding code word is "0". In other words, all the 9-bit code words that arrive in state A end with a "0". In fact, the last bit of all code words in lists $A_1$, $A_2$ and $\underline{B}$ is "0", where in general the set notation $\underline{X}$ implies that all the code words in $\underline{X}$ can be obtained by bit inversion of all the code words in X. Similarly, state B corresponds to the case in which the last bit of the preceding code word is "1". In other words, all the 9-bit code words that arrive in state B end with a "1". In fact, the last bit of all code words in the lists $\underline{A_1}$, $\underline{A_2}$ and B is "1". The code word lists $A_1$, $A_2$ are selected such that the time-varying j-constraint, the k=12 constraint, and the $t_c=7$ path memory constraint for j-constrained Viterbi detectors [2] are satisfied.

Examples of a rate-96/100 MTR (j=1,2,3)/unconstrained dual parity encoder and a counterpart decoder will now be described with reference to FIGS. 5 and 6.

In the following, $x_k$, $1 \leq k \leq m$, denotes the k-th bit in the array x[1:m] where $x_1$ is the least recent bit and $x_m$ is the most recent bit.

Figure 5:
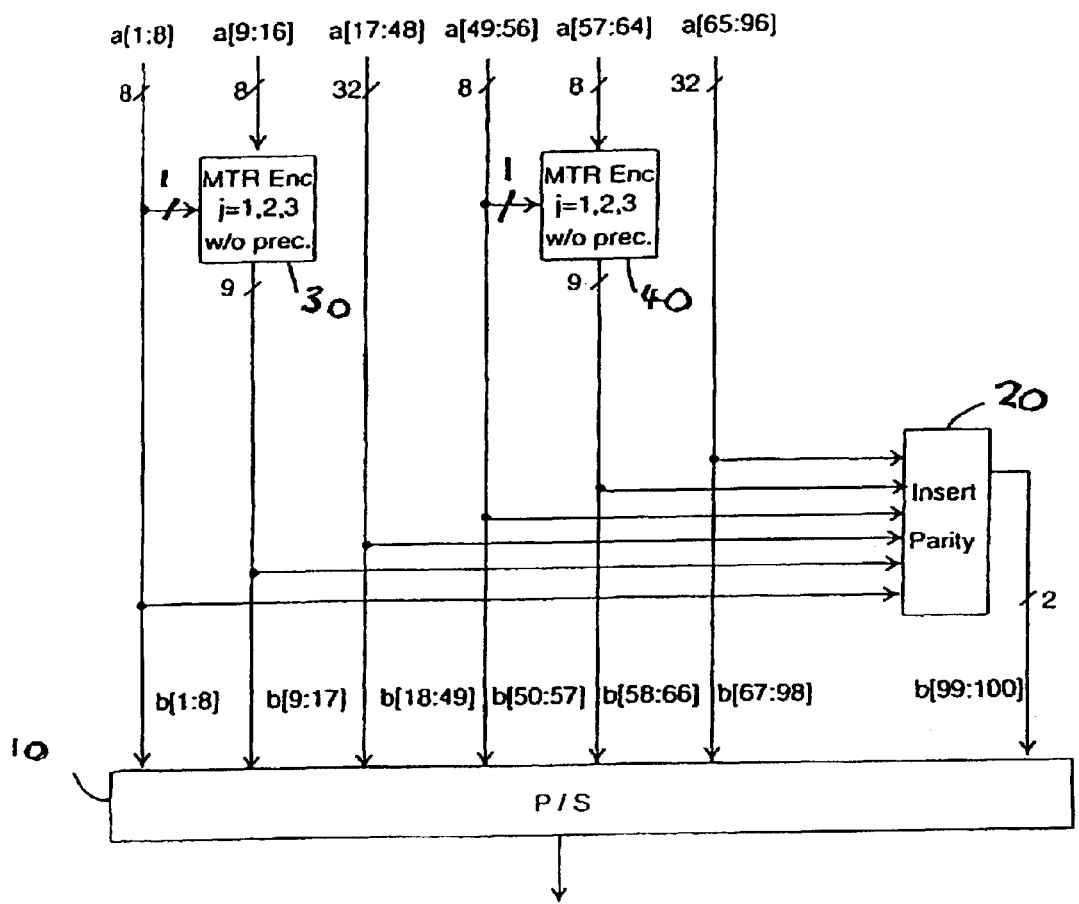
FIG. 5 is a block diagram of a rate-96/100 MTR (j=1,2,3)/unconstrained dual-parity encoder.

Referring to FIG. 5, the rate-96/100 encoder comprises a parallel to serial (P/S) convertor 10. A parity inserter 20 is connected for input to the P/S convertor 10. A first rate-8/9 MTR 2-state encoder 30 and a second rate-8/9 MTR 2-state encoder 40 are also connected for input to the P/S convertor 10. The input of the encoder, a[1:96], consists of 12 bytes. Each of the rate-8/9 MTR encoders 30 and 40 maps eight bits into nine bits according to Tables 1a, 1b, 1c and 1d appended hereto. As indicated in Table 1, this mapping depends on the value of the previous bit p. For example, $p=a_8$ and $p=a_{56}$ are the previous bits for MTR encoders 30 and 40, respectively. The output after rate-8/9 MTR block encoding is denoted by b[1:100] and consists of two 9-bit MTR code words satisfying a j=1,2,3 constraint interspersed with 10 unconstrained bytes. The parity inserter 20 generates parity bits $b_{99}$ and $b_{100}$ based on the following parity equations at the channel input.

$$\bigoplus_{i=0}^{49} b_{1+2i} = 0, \text{ and } \bigoplus_{i=0}^{49} b_{2+2i} = 0.$$

Note that in this coding scheme there is no precoding and inverse preceding. Thus, the output of the P/S convertor 10 can be fed directly to a write precompensation circuit.

Figure 6:
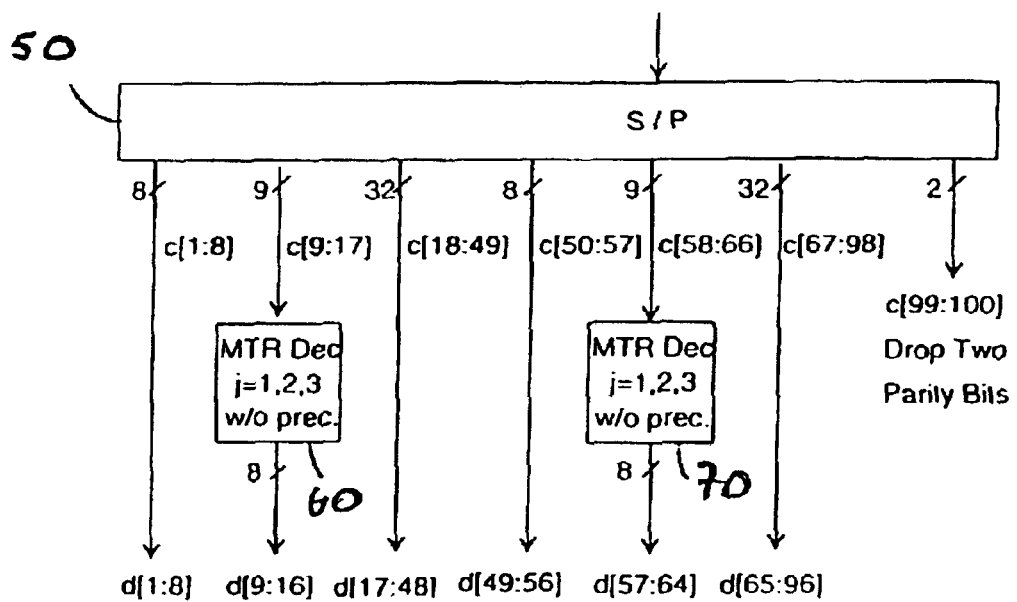
FIG. 6 is a block diagram of a rate-96/100 MTR (j=1,2,3)/unconstrained dual-parity decoder.

Referring now to FIG. 6, the rate-96/100 decoder comprises a serial to parallel (S/P) convertor 50. A first rate-8/9 MTR block decoder 60 and a second rate-8/9 MTR block decoder 70 are connected to receive outputs from the S/P convertor 50. The output from the S/P convertor 50 is denoted by c[1:100]. Note that the two parity bits c[99:100] are dropped. Each of the rate-8/9 MTR block decoders 60 and 70 performs the inverse mapping in accordance with Table 1. Note that a 9-bit legal code word can never occur simultaneously in two different rows of Table 1. Decoding is therefore unambiguous.

Examples of a rate-96/102 MTR (j=1,2,3)/Unconstrained Triple-Parity Encoder and a counterpart decoder will now be described with reference to FIGS. 7 and 8.

Figure 7:
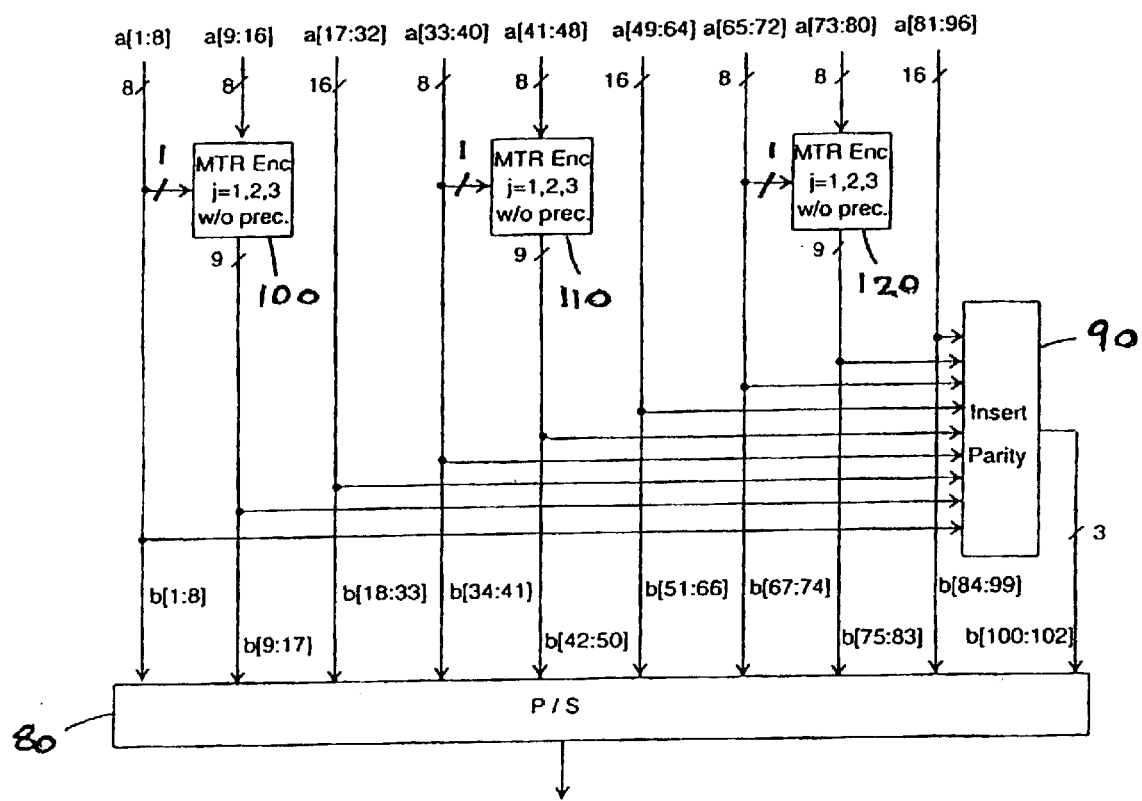
FIG. 7 is a block diagram of a rate-96/102 MTR (j=1,2,3)/unconstrained triple-parity encoder.

Referring to FIG. 7, the rate-96/102 triple-parity encoder comprises a P/S convertor 80. A parity inserter 90 is connected for input to the P/S convertor 80. A first rate-8/9 MTR 2-state encoder 100, a second rate-8/9 MTR 2-state encoder 110, and a third rate-8/9 MTR 2-state encoder 120 are also connected for input to the P/S convertor 80. Again, each of the rate-8/9 MTR encoders 100, 110, and 120 maps eight bits into nine bits according to Tables 1a, 1b, 1c and 1d. As indicated in Table 1, this mapping depends on the value of the previous bit p. For example, $p=a_8$, $p=a_{40}$ and $p=a_{72}$ are the previous bits for the MTR encoders 100, 110, and 120, respectively. The parity inserter 90 generates parity bits $b_{100}$ $b_{101}$ and $b_{102}$ based on the following parity equations at the channel input.

$$\bigoplus_{i=0}^{33} b_{1+3i} = 0, \quad (1)$$

$$\bigoplus_{i=0}^{33} b_{2+3i} = 0, \quad (2)$$

$$\bigoplus_{i=0}^{33} b_{3+3i} = 0. \quad (3)$$

For a polynomial code with generator polynomial $g(x)= 1+g_1x+g_2x^2+x^3$, the parity bits $b_{100}$ $b_{101}$ and $b_{102}$ can be determined according to the equation.

$$b_{100}x^2 + b_{101}x^1 + b_{102} = \left(\bigoplus_{i=1}^{99} b_i x^{102-i}\right) \mod g(x)$$

Based on this formulation the parity bits generated according to the equations (1)–(3) can also be obtained using the generator polynomial $1+x^3$. In principle, the generator polynomial is selected such that the polynomial code detects all error events from a specified list. In general, the parity bits can be selected according to any linear code specified by a parity check matrix. Note that in this coding scheme there is no precoding and inverse precoding. The output of the P/S convertor 80 can be fed directly to a write precompensation circuit.

Figure 8:
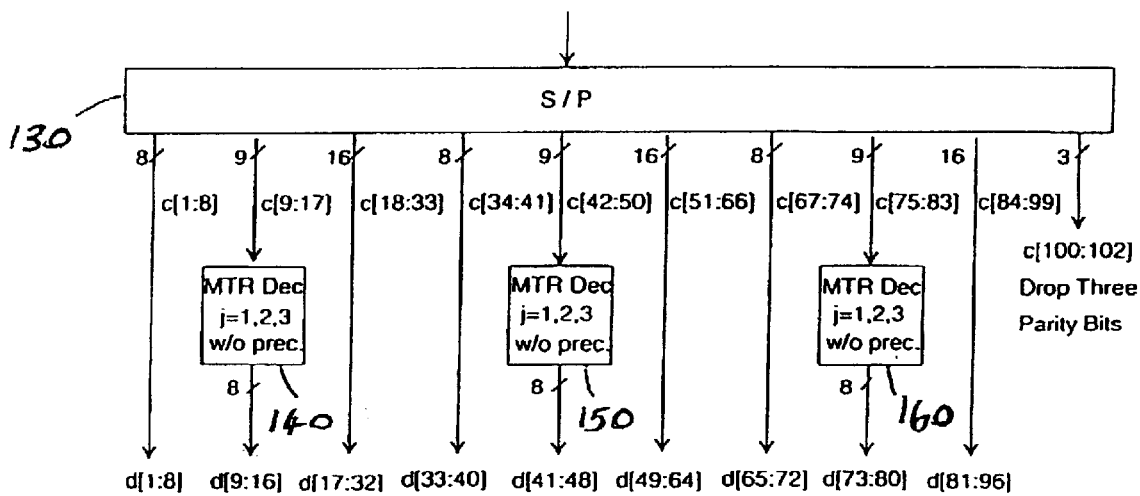
FIG. 8 is a block diagram of a rate-96/102 MTR (j=1,2,3)/unconstrained triple-parity decoder.

Referring to FIG. 8, the rate-96/102 decoder comprises an S/P convertor 130. A first rate-8/9 MTR block decoder 140, a second rate-8/9 MTR block decoder 150, and a third rate-8/9 MTR block decoder 160 are connected to receive outputs from the S/P convertor 130. The output from the S/P convertor 130 is denoted by c[1:102]. Note that the three parity bits c[99:100] are dropped. Each of the rate-8/9 MTR block decoders 140, 150, and 160 performs the inverse mapping in accordance with Table 1. Note that a 9-bit legal code word can never occur simultaneously in two different rows of Table 1. Thus, decoding is unambiguous.

Examples of a Rate-96/102 MTR (j=2,3)/Unconstrained Quadruple-Parity encoder and corresponding decoder will now be described with reference to FIGS. 9 and 10 respectively.

Figure 9:
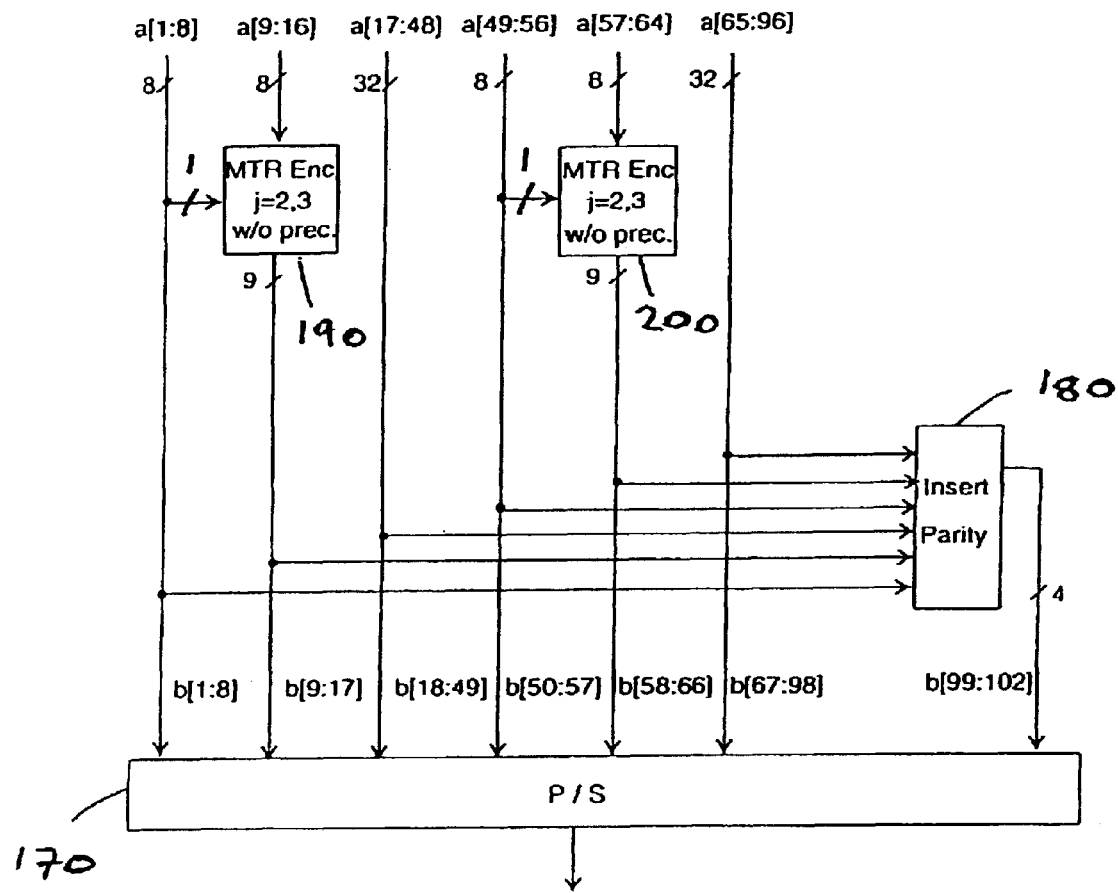
FIG. 9 is a block diagram of a rate-96/102 MTR (j=2,3)/unconstrained quadruple-parity encoder.

Referring to FIG. 9, the rate-96/102 quadruple-parity encoder comprises a P/S convertor 170. A parity inserter 180 is connected for input to the P/S convertor 170. A first rate-8/9 MTR 2-state encoder 190 and a second rate-8/9 MTR 2-state encoder 200 are also connected for input to the P/S convertor 170. Each of the rate-8/9 MTR encoders 190 and 200 maps eight bits into nine bits according to Tables 2a, 2b, 2c and 2d. As indicated in Table 2, this mapping depends on the value of the previous bit p. For example, $p=a_8$ and $p=a_{56}$ are the previous bits for the MTR encoders 190 and 200, respectively. The parity inserter computes parity bits $b_{99}$, $b_{100}$, $b_{101}$ and $b_{102}$ according to the following equation $$b_{99}x^3 + b_{100}x^2 + b_{101}x^1 + b_{102} = \left(\bigoplus_{i=1}^{98} b_i x^{102-i}\right) \mod g(x) \text{ where } g(x) = 1 + g_1 x + g_2 x^2 + g_3 x^3 + x^4.$$

In principle, the generator polynomial is selected such that the polynomial code detects all error events from a specified list. In general, the parity bits can be selected according to any linear code specified by a parity check matrix. Note that in this coding scheme there is no precoding and inverse precoding. The output of the P/S convertor 170 can be fed directly to the write precompensation circuit.

Figure 10:
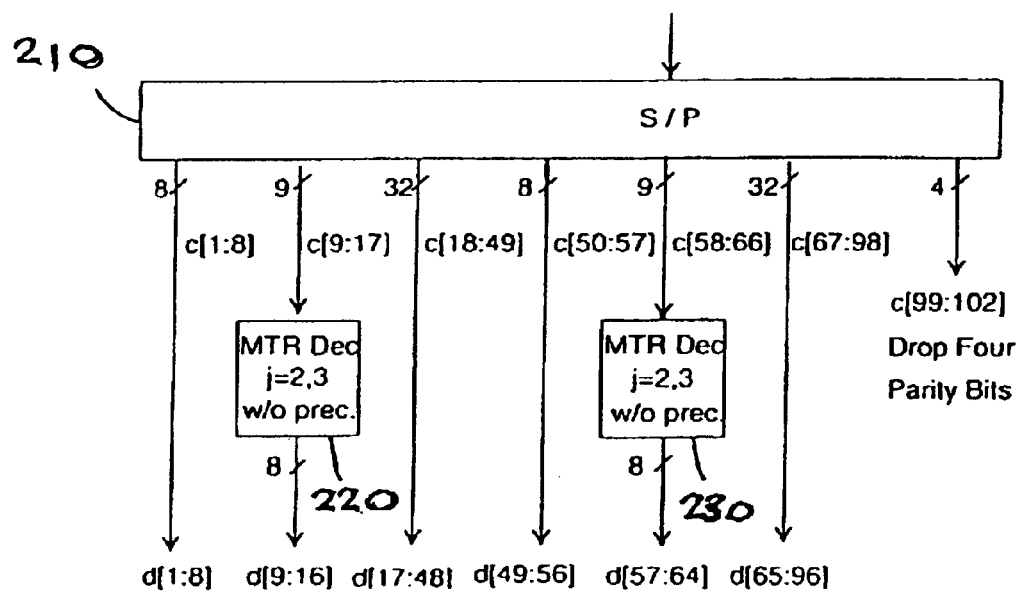
FIG. 10 is a block diagram of a rate-96/102 MTR (j=2,3)/unconstrained quadruple-parity decoder.

With reference to FIG. 10, the rate-96/102 decoder comprises an S/P convertor 210. A first rate-8/9 MTR block decoder 220 and a second rate-8/9 MTR block decoder 230 are connected to receive outputs from the S/P convertor 210. The output from the S/P convertor 210 is denoted by c[1:102]. Note that the four parity bits c[99:102] are dropped. Each of the rate-8/9 MTR block decoders 220 and 230 performs the inverse mapping in accordance with Table 2.

Note that a 9-bit legal code word can never occur simultaneously in two different rows of Table 2. Thus, decoding is unambiguous.

Examples of a Rate-96/102 (G=4, I=6)/Unconstrained Quadruple-Parity encoder and corresponding decoder will now be described with reference to FIGS. 11 and 12 respectively.

Figure 11:
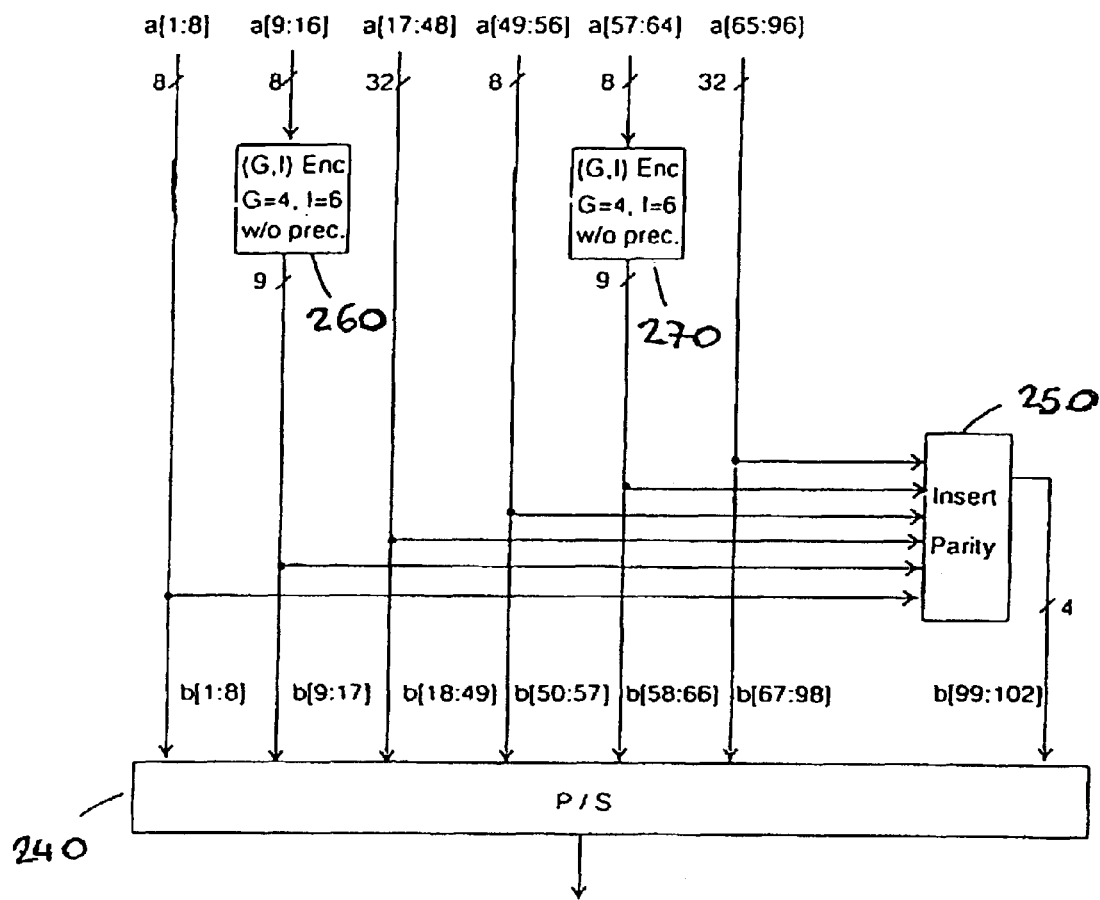
FIG. 11 is a block diagram of a rate-96/102 (G=4, I=6)/unconstrained quadruple-parity encoder; and, FIG. 12 is a block diagram of a rate-96/102 (G=4, I=6)/unconstrained quadruple-parity decoder.

Referring to FIG. 11, the rate-96/102 quadruple-parity encoder comprises a P/S convertor 240. A parity inserter 250 is connected for input to the P/S convertor 240. A first rate-8/9 (G,I) block encoder 260 and a second rate-8/9 (G,I) block encoder 270 are also connected for input to the P/S convertor 240. Each of the rate-8/9 block or stateless encoders 260 and 270 maps eight bits into nine bits according to Tables 3a, 3b, 3c and 3d. The parity inserter 250 computes parity bits $b_{99}$, $b_{100}$, $b_{101}$ and $b_{102}$ according to the following equation $$b_{99}x^3 + b_{100}x^2 + b_{101}x^1 + b_{102} = \left(\bigoplus_{i=1}^{98} b_i x^{102-i}\right) \mod g(x)$$

where $g(x)=1+g_1x+g_2x^2+g_3x^3+x^4$. In principle, the generator polynomial is selected such that the polynomial code detects all error events from a specified list. In general, the parity bits can be selected according to any linear code specified by a parity check matrix. Note that in this coding scheme there is no precoding and inverse precoding. The output of the P/S convertor 240 can be fed directly to a write precompensation circuit.

Figure 12:
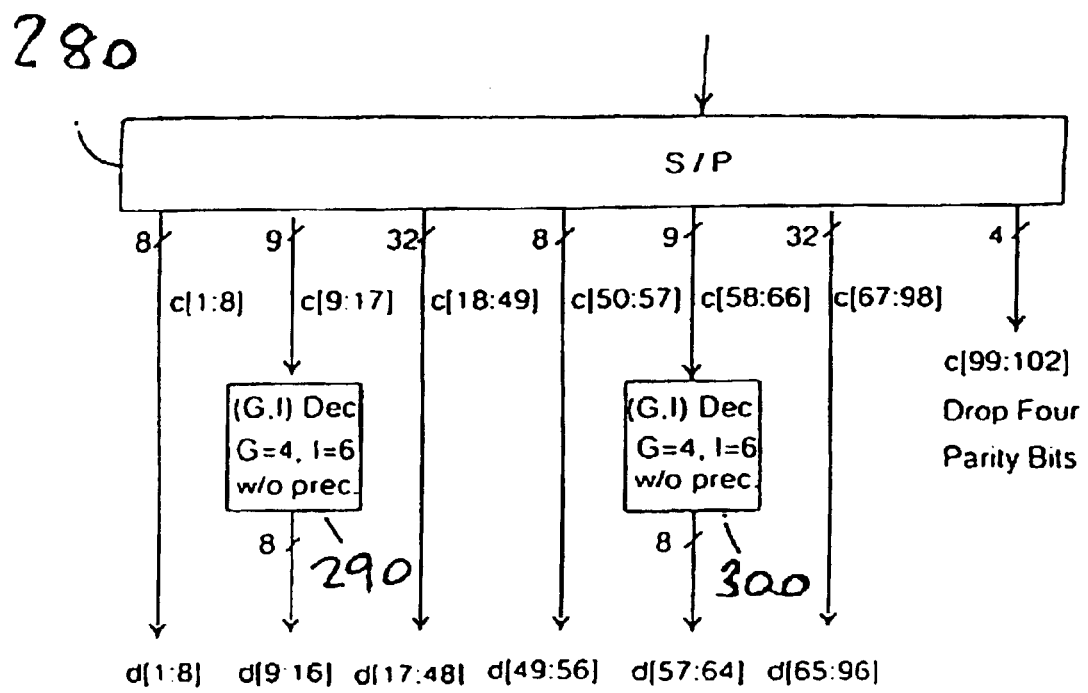

With reference to FIG. 12, the corresponding rate-96/102 decoder comprises an S/P convertor 280. A first rate-8/9 (G,I) block decoder 290 and a second rate-8/9 (G,I) block decoder 300 are connected to receive outputs from the S/P convertor 280. The output from the S/P convertor 280 is denoted by c[1:102]. Note that the four parity bits c[99:102] are dropped. Each of the rate-8/9 block decoders 290 and 300 performs the inverse mapping in accordance with Table 3.

While the invention has been described with respect to certain preferred embodiments and exemplifications, it is not intended to limit the scope of the claims thereby, but solely by the claims appended hereto.

TABLE 1a

Rate-8/9 MTR(j = 1,2,3; k = 12; $t_c$ = 7) precoderless code table (data words 1–64)

| INPUT | OUTPUT(p = 0) | OUTPUT(p = 1) | INPUT | OUTPUT(p = 0) | OUTPUT(p = 1) |
|---|---|---|---|---|---|
| 00000000 | 000000100 | 000000100 | 00100000 | 001111000 | 001111000 |
| 00000001 | 000011011 | 000011011 | 00100001 | 001111001 | 001111001 |
| 00000010 | 000110100 | 000110100 | 00100010 | 010000110 | 101111001 |
| 00000011 | 001110100 | 001110100 | 00100011 | 010000111 | 101111000 |
| 00000100 | 001111011 | 001111011 | 00100100 | 010001001 | 101110110 |
| 00000101 | 010000100 | 101111011 | 00100101 | 010001011 | 101110100 |
| 00000110 | 011000100 | 100111011 | 00100110 | 011000110 | 100111001 |
| 00000111 | 011001011 | 100110100 | 00100111 | 011000111 | 100111000 |
| 00001000 | 110001011 | 110001011 | 00101000 | 011001000 | 100110111 |
| 00001001 | 111000100 | 111000100 | 00101001 | 011001001 | 100110110 |
| 00001010 | 111001011 | 111001011 | 00101010 | 110000110 | 110000110 |
| 00001011 | 111011100 | 111011100 | 00101011 | 110000111 | 110000111 |
| 00001100 | 010110100 | 101001011 | 00101100 | 110001000 | 110001000 |
| 00001101 | 010111011 | 101000100 | 00101101 | 110001001 | 110001001 |
| 00001110 | 110110100 | 110110100 | 00101110 | 111000110 | 111000110 |
| 00001111 | 110111011 | 001000100 | 00101111 | 111000111 | 111000111 |
| 00010000 | 000000110 | 000000110 | 00110000 | 111001000 | 111001000 |
| 00010001 | 000000111 | 000000111 | 00110001 | 111001001 | 111001001 |
| 00010010 | 001000110 | 001000110 | 00110010 | 111011110 | 111011110 |
| 00010011 | 001000111 | 001000111 | 00110011 | 111011111 | 111011111 |
| 00010100 | 000001011 | 000001011 | 00110100 | 011100100 | 100011011 |
| 00010101 | 001001011 | 001001011 | 00110101 | 111100100 | 111100100 |
| 00010110 | 000011000 | 000011000 | 00110110 | 010110110 | 101001001 |
| 00010111 | 000011001 | 000011001 | 00110111 | 010110111 | 101001000 |
| 00011000 | 000100100 | 000100100 | 00111000 | 010111000 | 101000111 |
| 00011001 | 001100100 | 001100100 | 00111001 | 010111001 | 101000110 |
| 00011010 | 000110110 | 000110110 | 00111010 | 110110110 | 110110110 |
| 00011011 | 000110111 | 000110111 | 00111011 | 110110111 | 110110111 |
| 00011100 | 000111000 | 000111000 | 00111100 | 110111000 | 110111000 |
| 00011101 | 000111001 | 000111001 | 00111101 | 110111001 | 110111001 |
| 00011110 | 001110110 | 001110110 | 00111110 | 011110100 | 100001011 |
| 00011111 | 001110111 | 001110111 | 00111111 | 111110100 | 111110100 |

TABLE 1b

Rate-8/9 MTR(j = 1,2,3; k = 12; $t_c$ = 7) precoderless code table (data words 65–128)

| INPUT | OUTPUT(p = 0) | OUTPUT(p = 1) | INPUT | OUTPUT(p = 0) | OUTPUT(p = 1) |
|---|---|---|---|---|---|
| 01000000 | 001000000 | 001000000 | 01100000 | 001111100 | 001111100 |
| 01000001 | 001000001 | 001000001 | 01100001 | 001111101 | 001111101 |
| 01000010 | 001000010 | 001000010 | 01100010 | 001111110 | 001111110 |
| 01000011 | 001000011 | 001000011 | 01100011 | 001111111 | 001111111 |
| 01000100 | 000001000 | 000001000 | 01100100 | 010000000 | 101111111 |
| 01000101 | 000001001 | 000001001 | 01100101 | 010000001 | 101111110 |
| 01000110 | 001001000 | 001001000 | 01100110 | 010000010 | 101111101 |
| 01000111 | 001001001 | 001001001 | 01100111 | 010000011 | 101111100 |
| 01001000 | 000010000 | 000010000 | 01101000 | 010001100 | 101110011 |
| 01001001 | 000010001 | 000010001 | 01101001 | 010001101 | 101110010 |
| 01001010 | 000010010 | 000010010 | 01101010 | 010001110 | 101110001 |
| 01001011 | 000010011 | 000010011 | 01101011 | 010001111 | 101110000 |
| 01001100 | 000011100 | 000011100 | 01101100 | 011000000 | 100111111 |
| 01001101 | 000011101 | 000011101 | 01101101 | 011000001 | 100111110 |
| 01001110 | 000011110 | 000011110 | 01101110 | 011000010 | 100111101 |
| 01001111 | 000011111 | 000011111 | 01101111 | 011000011 | 100111100 |
| 01010000 | 000100110 | 000100110 | 01110000 | 011001100 | 100110011 |
| 01010001 | 000100111 | 000100111 | 01110001 | 011001101 | 100110010 |
| 01010010 | 001100110 | 001100110 | 01110010 | 011001110 | 100110001 |
| 01010011 | 001100111 | 001100111 | 01110011 | 011001111 | 100110000 |
| 01010100 | 000110000 | 000110000 | 01110100 | 110000000 | 110000000 |
| 01010101 | 000110001 | 000110001 | 01110101 | 110000001 | 110000001 |
| 01010110 | 000110010 | 000110010 | 01110110 | 110000010 | 110000010 |
| 01010111 | 000110011 | 000110011 | 01110111 | 110000011 | 110000011 |
| 01011000 | 000111100 | 000111100 | 01111000 | 110001100 | 110001100 |

TABLE 1b-continued

Rate-8/9 MTR(j = 1,2,3; k = 12; t_c = 7) precoderless code table (data words 65–128)

| INPUT | OUTPUT(p = 0) | OUTPUT(p = 1) | INPUT | OUTPUT(p = 0) | OUTPUT(p = 1) |
|---|---|---|---|---|---|
| 01011001 | 000111101 | 000111101 | 01111001 | 110001101 | 110001101 |
| 01011010 | 000111110 | 000111110 | 01111010 | 110001110 | 110001110 |
| 01011011 | 000111111 | 000111111 | 01111011 | 110001111 | 110001111 |
| 01011100 | 001110000 | 001110000 | 01111100 | 111000000 | 111000000 |
| 01011101 | 001110001 | 001110001 | 01111101 | 111000001 | 111000001 |
| 01011110 | 001110010 | 001110010 | 01111110 | 111000010 | 111000010 |
| 01011111 | 001110011 | 001110011 | 01111111 | 111000011 | 111000011 |

TABLE 1c

Rate-8/9 MTR(j = 1,2,3; k = 12; t_c = 7) precoderless code table (data words 129–192)

| INPUT | OUTPUT(p = 0) | OUTPUT(p = 1) | INPUT | OUTPUT(p = 0) | OUTPUT(p = 1) |
|---|---|---|---|---|---|
| 10000000 | 111001100 | 111001100 | 10100000 | 011110110 | 100001001 |
| 10000001 | 111001101 | 111001101 | 10100001 | 011110111 | 100001000 |
| 10000010 | 111001110 | 111001110 | 10100010 | 111110110 | 111110110 |
| 10000011 | 111001111 | 111001111 | 10100011 | 111110111 | 111110111 |
| 10000100 | 010011011 | 101100100 | 10100100 | 011111011 | 100000100 |
| 10000101 | 011011011 | 100100100 | 10100101 | 011111110 | 100000001 |
| 10000110 | 110011011 | 110011011 | 10100110 | 111111011 | 111111011 |
| 10000111 | 111011011 | 111011011 | 10100111 | 111111110 | 000000001 |
| 10001000 | 110011100 | 110011100 | 10101000 | 000001100 | 000001100 |
| 10001001 | 110011101 | 110011101 | 10101001 | 000001101 | 000001101 |
| 10001010 | 110011110 | 110011110 | 10101010 | 000001110 | 000001110 |
| 10001011 | 110011111 | 110011111 | 10101011 | 000001111 | 000001111 |
| 10001100 | 011100110 | 100011001 | 10101100 | 001001100 | 001001100 |
| 10001101 | 011100111 | 100011000 | 10101101 | 001001101 | 001001101 |
| 10001110 | 111100110 | 111100110 | 10101110 | 001001110 | 001001110 |
| 10001111 | 111100111 | 111100111 | 10101111 | 001001111 | 001001111 |
| 10010000 | 010110000 | 101001111 | 10110000 | 000100000 | 000100000 |
| 10010001 | 010110001 | 101001110 | 10110001 | 000100001 | 000100001 |
| 10010010 | 010110010 | 101001101 | 10110010 | 000100010 | 111011101 |
| 10010011 | 010110011 | 101001100 | 10110011 | 000100011 | 000100011 |
| 10010100 | 010111100 | 101000011 | 10110100 | 001100000 | 001100000 |
| 10010101 | 010111101 | 101000010 | 10110101 | 001100001 | 001100001 |
| 10010110 | 010111110 | 101000001 | 10110110 | 001100010 | 001100010 |
| 10010111 | 010111111 | 101000000 | 10110111 | 001100011 | 001100011 |
| 10011000 | 110110000 | 110110000 | 10111000 | 000101100 | 000101100 |
| 10011001 | 110110001 | 110110001 | 10111001 | 000101101 | 000101101 |
| 10011010 | 110110010 | 110110010 | 10111010 | 000101110 | 000101110 |
| 10011011 | 110110011 | 110110011 | 10111011 | 000101111 | 000101111 |
| 10011100 | 110111100 | 110111100 | 10111100 | 001101100 | 001101100 |
| 10011101 | 110111101 | 110111101 | 10111101 | 001101101 | 001101101 |
| 10011110 | 110111110 | 110111110 | 10111110 | 001101110 | 001101110 |
| 10011111 | 110111111 | 110111111 | 10111111 | 001101111 | 001101111 |

TABLE 1d

Rate-8/9 MTR(j = 1,2,3; k = 12; t_c = 7) precoderless code table (data words 193–256)

| INPUT | OUTPUT(p = 0) | OUTPUT(p = 1) | INPUT | OUTPUT(p = 0) | OUTPUT(p = 1) |
|---|---|---|---|---|---|
| 11000000 | 010011000 | 101100111 | 11100000 | 011110000 | 100001111 |
| 11000001 | 010011001 | 101100110 | 11100001 | 011110001 | 100001110 |
| 11000010 | 110011000 | 110011000 | 11100010 | 011110010 | 100001101 |
| 11000011 | 110011001 | 110011001 | 11100011 | 011110011 | 100001100 |
| 11000100 | 011011000 | 100100111 | 11100100 | 111110000 | 111110000 |
| 11000101 | 011011001 | 100100110 | 11100101 | 111110001 | 111110001 |
| 11000110 | 111011000 | 111011000 | 11100110 | 111110010 | 111110010 |
| 11000111 | 111011001 | 111011001 | 11100111 | 111110011 | 111110011 |
| 11001000 | 010011100 | 101100011 | 11101000 | 011111000 | 100000111 |
| 11001001 | 010011101 | 101100010 | 11101001 | 011111001 | 100000110 |
| 11001010 | 010011110 | 101100001 | 11101010 | 111111000 | 111111000 |
| 11001011 | 010011111 | 101100000 | 11101011 | 111111001 | 111111001 |
| 11001100 | 011011100 | 100100011 | 11101100 | 011111100 | 100000011 |
| 11001101 | 011011101 | 100100010 | 11101101 | 011111101 | 100000010 |
| 11001110 | 011011110 | 100100001 | 11101110 | 111111100 | 000000011 |
| 11001111 | 011011111 | 100100000 | 11101111 | 111111101 | 000000010 |
| 11010000 | 011100000 | 100011111 | 11110000 | 010010000 | 101101111 |

TABLE 1d-continued

Rate-8/9 MTR(j = 1,2,3; k = 12; $t_c$ = 7) precoderless code table (data words 193–256)

| INPUT | OUTPUT(p = 0) | OUTPUT(p = 1) | INPUT | OUTPUT(p = 0) | OUTPUT(p = 1) |
|---|---|---|---|---|---|
| 11010001 | 011100001 | 100011110 | 11110001 | 010010001 | 101101110 |
| 11010010 | 011100010 | 100011101 | 11110010 | 010010010 | 101101101 |
| 11010011 | 011100011 | 100011100 | 11110011 | 010010011 | 101101100 |
| 11010100 | 111100000 | 111100000 | 11110100 | 011010000 | 100101111 |
| 11010101 | 111100001 | 111100001 | 11110101 | 011010001 | 100101110 |
| 11010110 | 111100010 | 111100010 | 11110110 | 011010010 | 100101101 |
| 11010111 | 111100011 | 111100011 | 11110111 | 011010011 | 100101100 |
| 11011000 | 011101100 | 100010011 | 11111000 | 110010000 | 110010000 |
| 11011001 | 011101101 | 100010010 | 11111001 | 110010001 | 110010001 |
| 11011010 | 011101110 | 100010001 | 11111010 | 110010010 | 110010010 |
| 11011011 | 011101111 | 100010000 | 11111011 | 110010011 | 110010011 |
| 11011100 | 111101100 | 111101100 | 11111100 | 111010000 | 111010000 |
| 11011101 | 111101101 | 111101101 | 11111101 | 111010001 | 111010001 |
| 11011110 | 111101110 | 111101110 | 11111110 | 111010010 | 111010010 |
| 11011111 | 111101111 | 111101111 | 11111111 | 111010011 | 111010011 |

TABLE 2a

Rate-8/9 MTR(j = 2,3; k = 9; $t_n$ = 6) precoderless code table (data words 1–64)

| INPUT | OUTPUT(p = 0) | OUTPUT(p = 1) | INPUT | OUTPUT(p = 0) | OUTPUT(p = 1) |
|---|---|---|---|---|---|
| 00000000 | 000100011 | 000100011 | 00100000 | 000011011 | 000011011 |
| 00000001 | 000100100 | 000100100 | 00100001 | 000111011 | 000111011 |
| 00000010 | 000110100 | 000110100 | 00100010 | 000111100 | 000111100 |
| 00000011 | 000111110 | 000111110 | 00100011 | 000111101 | 000111101 |
| 00000100 | 001000011 | 001000011 | 00100100 | 001000110 | 001000110 |
| 00000101 | 001001011 | 001001011 | 00100101 | 001000111 | 001000111 |
| 00000110 | 001111011 | 001111011 | 00100110 | 001001000 | 001001000 |
| 00000111 | 001111110 | 001111110 | 00100111 | 001001001 | 001001001 |
| 00001000 | 011000001 | 011000001 | 00101000 | 001100100 | 001100100 |
| 00001001 | 011000100 | 011000100 | 00101001 | 001110100 | 001110100 |
| 00001010 | 010000011 | 101111100 | 00101010 | 001111000 | 001111000 |
| 00001011 | 010010001 | 101101110 | 00101011 | 001111001 | 001111001 |
| 00001100 | 010011011 | 101100100 | 00101100 | 001111100 | 001111100 |
| 00001101 | 010110100 | 101001011 | 00101101 | 001111101 | 001111101 |
| 00001110 | 100000011 | 100000011 | 00101110 | 011000010 | 011000010 |
| 00001111 | 110001011 | 110001011 | 00101111 | 011000011 | 011000011 |
| 00010000 | 100100100 | 100100100 | 00110000 | 011000110 | 011000110 |
| 00010001 | 110011011 | 110011011 | 00110001 | 011000111 | 011000111 |
| 00010010 | 100111110 | 100111110 | 00110010 | 011001011 | 011001011 |
| 00010011 | 110111100 | 110111100 | 00110011 | 011011011 | 011011011 |
| 00010100 | 111000001 | 111000001 | 00110100 | 011100100 | 011100100 |
| 00010101 | 111001011 | 111001011 | 00110101 | 011110100 | 011110100 |
| 00010110 | 111011011 | 111011011 | 00110110 | 011101100 | 011101100 |
| 00010111 | 111011100 | 111011100 | 00110111 | 011101101 | 011101101 |
| 00011000 | 000010010 | 000010010 | 00111000 | 010000110 | 101111001 |
| 00011001 | 000010011 | 000010011 | 00111001 | 010000111 | 101111000 |
| 00011010 | 000100110 | 000100110 | 00111010 | 010001001 | 101110110 |
| 00011011 | 000100111 | 000100111 | 00111011 | 010001011 | 101110100 |
| 00011100 | 000110110 | 000110110 | 00111100 | 010010010 | 101101101 |
| 00011101 | 000110111 | 000110111 | 00111101 | 010010011 | 101101100 |
| 00011110 | 000001001 | 000001001 | 00111110 | 010110110 | 101001001 |
| 00011111 | 000001011 | 000001011 | 00111111 | 010110111 | 101001000 |

TABLE 2b

Rate-8/9 MTR(j = 2,3; k = 9; $t_n$ = 6) precoderless code table (data words 65–128)

| INPUT | OUTPUT(p = 0) | OUTPUT(p = 1) | INPUT | OUTPUT(p = 0) | OUTPUT(p = 1) |
|---|---|---|---|---|---|
| 01000000 | 010111100 | 101000011 | 01100000 | 000110000 | 000110000 |
| 01000001 | 010111101 | 101000010 | 01100001 | 000110001 | 000110001 |
| 01000010 | 100000110 | 100000110 | 01100010 | 000110010 | 000110010 |
| 01000011 | 100000111 | 100000111 | 01100011 | 000110011 | 000110011 |
| 01000100 | 100001001 | 100001001 | 01100100 | 000011000 | 000011000 |
| 01000101 | 100001011 | 100001011 | 01100101 | 000011001 | 000011001 |

TABLE 2b-continued

Rate-8/9 MTR(j = 2,3; k = 9; $t_u$ = 6) precoderless code table (data words 65–128)

| INPUT | OUTPUT(p = 0) | OUTPUT(p = 1) | INPUT | OUTPUT(p = 0) | OUTPUT(p = 1) |
|---|---|---|---|---|---|
| 01000110 | 110000001 | 110000001 | 01100110 | 000111000 | 000111000 |
| 01000111 | 110000100 | 110000100 | 01100111 | 000111001 | 000111001 |
| 01001000 | 110001000 | 110001000 | 01101000 | 000101100 | 000101100 |
| 01001001 | 110001001 | 110001001 | 01101001 | 000101101 | 000101101 |
| 01001010 | 100100110 | 100100110 | 01101010 | 000101110 | 000101110 |
| 01001011 | 100100111 | 100100111 | 01101011 | 000101111 | 000101111 |
| 01001100 | 100010010 | 100010010 | 01101100 | 001001100 | 001001100 |
| 01001101 | 100010011 | 100010011 | 01101101 | 001001101 | 001001101 |
| 01001110 | 100011011 | 100011011 | 01101110 | 001001110 | 001001110 |
| 01001111 | 100111011 | 100111011 | 01101111 | 001001111 | 001001111 |
| 01010000 | 100110100 | 100110100 | 01110000 | 001100110 | 001100110 |
| 01010001 | 110110100 | 110110100 | 01110001 | 001100111 | 001100111 |
| 01010010 | 100111100 | 100111100 | 01110010 | 001110110 | 001110110 |
| 01010011 | 100111101 | 100111101 | 01110011 | 001110111 | 001110111 |
| 01010100 | 111000010 | 111000010 | 01110100 | 001101100 | 001101100 |
| 01010101 | 111000011 | 111000011 | 01110101 | 001101101 | 001101101 |
| 01010110 | 111000100 | 111000100 | 01110110 | 001101110 | 001101110 |
| 01010111 | 111100100 | 111100100 | 01110111 | 001101111 | 001101111 |
| 01011000 | 111110100 | 111110100 | 01111000 | 011010000 | 011010000 |
| 01011001 | 111110110 | 111110110 | 01111001 | 011010001 | 011010001 |
| 01011010 | 111001000 | 111001000 | 01111010 | 011010010 | 011010010 |
| 01011011 | 111001001 | 111001001 | 01111011 | 011010011 | 011010011 |
| 01011100 | 111011000 | 111011000 | 01111100 | 011001000 | 011001000 |
| 01011101 | 111011001 | 111011001 | 01111101 | 011001001 | 011001001 |
| 01011110 | 111101100 | 111101100 | 01111110 | 011011000 | 011011000 |
| 01011111 | 111101101 | 111101101 | 01111111 | 011011001 | 011011001 |

TABLE 2c

Rate-8/9 MTR(j = 2,3; k = 9; $t_u$ = 6) precoderless code table (data words 129–192)

| INPUT | OUTPUT(p = 0) | OUTPUT(p = 1) | INPUT | OUTPUT(p = 0) | OUTPUT(p = 1) |
|---|---|---|---|---|---|
| 10000000 | 011100110 | 011100110 | 10100000 | 110001100 | 110001100 |
| 10000001 | 011100111 | 011100111 | 10100001 | 110001101 | 110001101 |
| 10000010 | 011110110 | 011110110 | 10100010 | 110001110 | 110001110 |
| 10000011 | 011110111 | 011110111 | 10100011 | 110001111 | 110001111 |
| 10000100 | 011111000 | 011111000 | 10100100 | 100100000 | 100100000 |
| 10000101 | 011111001 | 011111001 | 10100101 | 100100001 | 100100001 |
| 10000110 | 011111100 | 011111100 | 10100110 | 100100010 | 100100010 |
| 10000111 | 011111101 | 011111101 | 10100111 | 100100011 | 100100011 |
| 10001000 | 010001100 | 101110011 | 10101000 | 100101100 | 100101100 |
| 10001001 | 010001101 | 101110010 | 10101001 | 100101101 | 100101101 |
| 10001010 | 010001110 | 101110001 | 10101010 | 100101110 | 100101110 |
| 10001011 | 010001111 | 101110000 | 10101011 | 100101111 | 100101111 |
| 10001100 | 010110000 | 101001111 | 10101100 | 100110000 | 100110000 |
| 10001101 | 010110001 | 101001110 | 10101101 | 100110001 | 100110001 |
| 10001110 | 010110010 | 101001101 | 10101110 | 100110010 | 100110010 |
| 10001111 | 010110011 | 101001100 | 10101111 | 100110011 | 100110011 |
| 10010000 | 010011000 | 101100111 | 10110000 | 100110110 | 100110110 |
| 10010001 | 010011001 | 101100110 | 10110001 | 100110111 | 100110111 |
| 10010010 | 010111000 | 101000111 | 10110010 | 110110110 | 110110110 |
| 10010011 | 010111001 | 101000110 | 10110011 | 110110111 | 110110111 |
| 10010100 | 010011100 | 101100011 | 10110100 | 111010000 | 111010000 |
| 10010101 | 010011101 | 101100010 | 10110101 | 111010001 | 111010001 |
| 10010110 | 010011110 | 101100001 | 10110110 | 111010010 | 111010010 |
| 10010111 | 010011111 | 101100000 | 10110111 | 111010011 | 111010011 |
| 10011000 | 100001100 | 100001100 | 10111000 | 111000110 | 111000110 |
| 10011001 | 100001101 | 100001101 | 10111001 | 111000111 | 111000111 |
| 10011010 | 100001110 | 100001110 | 10111010 | 111100110 | 111100110 |
| 10011011 | 100001111 | 100001111 | 10111011 | 111100111 | 111100111 |
| 10011100 | 110000010 | 110000010 | 10111100 | 111001100 | 111001100 |
| 10011101 | 110000011 | 110000011 | 10111101 | 111001101 | 111001101 |
| 10011110 | 110000110 | 110000110 | 10111110 | 111001110 | 111001110 |
| 10011111 | 110000111 | 110000111 | 10111111 | 111001111 | 111001111 |

TABLE 2d

Rate-8/9 MTR(j = 2,3; k = 9; t_n = 6) precoderless code table (data words 193–256)

| INPUT | OUTPUT(p = 0) | OUTPUT(p = 1) | INPUT | OUTPUT(p = 0) | OUTPUT(p = 1) |
|---|---|---|---|---|---|
| 11000000 | 000001100 | 000001100 | 11100000 | 110010000 | 110010000 |
| 11000001 | 000001101 | 000001101 | 11100001 | 110010001 | 110010001 |
| 11000010 | 000001110 | 000001110 | 11100010 | 110010010 | 110010010 |
| 11000011 | 000001111 | 000001111 | 11100011 | 110010011 | 110010011 |
| 11000100 | 000011100 | 000011100 | 11100100 | 110110000 | 110110000 |
| 11000101 | 000011101 | 000011101 | 11100101 | 110110001 | 110110001 |
| 11000110 | 000011110 | 000011110 | 11100110 | 110110010 | 110110010 |
| 11000111 | 000011111 | 000011111 | 11100111 | 110110011 | 110110011 |
| 11001000 | 001100000 | 001100000 | 11101000 | 100011000 | 100011000 |
| 11001001 | 001100001 | 001100001 | 11101001 | 100011001 | 100011001 |
| 11001010 | 001100010 | 001100010 | 11101010 | 100111000 | 100111000 |
| 11001011 | 001100011 | 001100011 | 11101011 | 100111001 | 100111001 |
| 11001100 | 001110000 | 001110000 | 11101100 | 110011000 | 110011000 |
| 11001101 | 001110001 | 001110001 | 11101101 | 110011001 | 110011001 |
| 11001110 | 001110010 | 001110010 | 11101110 | 110111000 | 110111000 |
| 11001111 | 001110011 | 001110011 | 11101111 | 110111001 | 110111001 |
| 11010000 | 011001100 | 011001100 | 11110000 | 100011100 | 100011100 |
| 11010001 | 011001101 | 011001101 | 11110001 | 100011101 | 100011101 |
| 11010010 | 011001110 | 011001110 | 11110010 | 100011110 | 100011110 |
| 11010011 | 011001111 | 011001111 | 11110011 | 100011111 | 100011111 |
| 11010100 | 011011100 | 011011100 | 11110100 | 110011100 | 110011100 |
| 11010101 | 011011101 | 011011101 | 11110101 | 110011101 | 110011101 |
| 11010110 | 011011110 | 011011110 | 11110110 | 110011110 | 110011110 |
| 11010111 | 011011111 | 011011111 | 11110111 | 110011111 | 110011111 |
| 11011000 | 011100000 | 011100000 | 11111000 | 111100000 | 111100000 |
| 11011001 | 011100001 | 011100001 | 11111001 | 111100001 | 111100001 |
| 11011010 | 011100010 | 011100010 | 11111010 | 111100010 | 111100010 |
| 11011011 | 011100011 | 011100011 | 11111011 | 111100011 | 111100011 |
| 11011100 | 011110000 | 011110000 | 11111100 | 111110000 | 111110000 |
| 11011101 | 011110001 | 011110001 | 11111101 | 111110001 | 111110001 |
| 11011110 | 011110010 | 011110010 | 11111110 | 111110010 | 111110010 |
| 11011111 | 011110011 | 011110011 | 11111111 | 111110011 | 111110011 |

TABLE 3a

Rate-8/9 (G = 4, I = 6) precoderless code table (data words 1–64)

| INPUT | OUTPUT | INPUT | OUTPUT |
|---|---|---|---|
| 00000000 | 000110001 | 00100000 | 110001011 |
| 00000001 | 000110100 | 00100001 | 110001110 |
| 00000010 | 000111011 | 00100010 | 110011011 |
| 00000011 | 000111110 | 00100011 | 110011110 |
| 00000100 | 010010001 | 00100100 | 101100001 |
| 00000101 | 010010100 | 00100101 | 101100100 |
| 00000110 | 010011011 | 00100110 | 111000001 |
| 00000111 | 010011110 | 00100111 | 111000100 |
| 00001000 | 001100001 | 00101000 | 000100111 |
| 00001001 | 001100100 | 00101001 | 000101101 |
| 00001010 | 001101011 | 00101010 | 010000111 |
| 00001011 | 001101110 | 00101011 | 010001101 |
| 00001100 | 001110001 | 00101100 | 000110010 |
| 00001101 | 001110100 | 00101101 | 000110110 |
| 00001110 | 001111011 | 00101110 | 000110011 |
| 00001111 | 001111110 | 00101111 | 000110111 |
| 00010000 | 011000001 | 00110000 | 000111000 |
| 00010001 | 011000100 | 00110001 | 000111100 |
| 00010010 | 011001011 | 00110010 | 000111001 |
| 00010011 | 011001110 | 00110011 | 000111101 |
| 00010100 | 011010001 | 00110100 | 010010010 |
| 00010101 | 011010100 | 00110101 | 010010110 |
| 00010110 | 011011011 | 00110110 | 010010011 |
| 00010111 | 011011110 | 00110111 | 010010111 |
| 00011000 | 100101011 | 00111000 | 010011000 |
| 00011001 | 100101110 | 00111001 | 010011100 |
| 00011010 | 100110001 | 00111010 | 010011001 |
| 00011011 | 100110100 | 00111011 | 010011101 |
| 00011100 | 100111011 | 00111100 | 001001011 |

TABLE 3a-continued

Rate-8/9 (G = 4, I = 6) precoderless code table (data words 1–64)

| INPUT | OUTPUT | INPUT | OUTPUT |
|---|---|---|---|
| 00011101 | 100111110 | 00111101 | 001001110 |
| 00011110 | 110000001 | 00111110 | 001011011 |
| 00011111 | 110000100 | 00111111 | 001011110 |

TABLE 3b

Rate-8/9 (G = 4, I = 6) precoderless code table(data words 65–128)

| INPUT | OUTPUT | INPUT | OUTPUT |
|---|---|---|---|
| 01000000 | 001100010 | 01100000 | 011100001 |
| 01000001 | 001100110 | 01100001 | 011100100 |
| 01000010 | 001100011 | 01100010 | 011110001 |
| 01000011 | 001100111 | 01100011 | 011110100 |
| 01000100 | 001101000 | 01100100 | 100001011 |
| 01000101 | 001101100 | 01100101 | 100001110 |
| 01000110 | 001101001 | 01100110 | 100011011 |
| 01000111 | 001101101 | 01100111 | 100011110 |
| 01001000 | 001110010 | 01101000 | 100100010 |
| 01001001 | 001110110 | 01101001 | 100100110 |
| 01001010 | 001110011 | 01101010 | 100100011 |
| 01001011 | 001110111 | 01101011 | 100100111 |
| 01001100 | 001111000 | 01101100 | 100101000 |
| 01001101 | 001111100 | 01101101 | 100101100 |
| 01001110 | 001111001 | 01101110 | 100101001 |
| 01001111 | 001111101 | 01101111 | 100101101 |
| 01010000 | 011000010 | 01110000 | 100110010 |
| 01010001 | 011000110 | 01110001 | 100110110 |
| 01010010 | 011000011 | 01110010 | 100110011 |
| 01010011 | 011000111 | 01110011 | 100110111 |

TABLE 3b-continued

Rate-8/9 (G = 4, I = 6) precoderless code table(data words 65–128)

| INPUT | OUTPUT | INPUT | OUTPUT |
|---|---|---|---|
| 01010100 | 011001000 | 01110100 | 100111000 |
| 01010101 | 011001100 | 01110101 | 100111100 |
| 01010110 | 011001001 | 01110110 | 100111001 |
| 01010111 | 011001101 | 01110111 | 100111101 |
| 01011000 | 011010010 | 01111000 | 110000010 |
| 01011001 | 011010110 | 01111001 | 110000110 |
| 01011010 | 011010011 | 01111010 | 110000011 |
| 01011011 | 011010111 | 01111011 | 110000111 |
| 01011100 | 011011000 | 01111100 | 110001000 |
| 01011101 | 011011100 | 01111101 | 110001100 |
| 01011110 | 011011001 | 01111110 | 110001001 |
| 01011111 | 011011101 | 01111111 | 110001101 |

TABLE 3c

Rate-8/9 (G = 4, I = 6) precoderless code table (data words 129–192)

| INPUT | OUTPUT | INPUT | OUTPUT |
|---|---|---|---|
| 10000000 | 110010010 | 10100000 | 000100001 |
| 10000001 | 110010110 | 10100001 | 000101001 |
| 10000010 | 110010011 | 10100010 | 010000001 |
| 10000011 | 110010111 | 10100011 | 010001001 |
| 10000100 | 110011000 | 10100100 | 000100011 |
| 10000101 | 110011100 | 10100101 | 000101011 |
| 10000110 | 110011001 | 10100110 | 010000011 |
| 10000111 | 110011101 | 10100111 | 010001011 |
| 10001000 | 110100001 | 10101000 | 000100100 |
| 10001001 | 110100110 | 10101001 | 000101100 |
| 10001010 | 110110001 | 10101010 | 010000100 |
| 10001011 | 110110100 | 10101011 | 010001100 |
| 10001100 | 101100010 | 10101100 | 000100110 |
| 10001101 | 101100110 | 10101101 | 000101110 |
| 10001110 | 101100011 | 10101110 | 010000110 |
| 10001111 | 101100111 | 10101111 | 010001110 |
| 10010000 | 101101000 | 10110000 | 001000010 |
| 10010001 | 101101100 | 10110001 | 001000110 |
| 10010010 | 101101001 | 10110010 | 001000011 |
| 10010011 | 101101101 | 10110011 | 001000111 |
| 10010100 | 111000010 | 10110100 | 001010010 |
| 10010101 | 111000110 | 10110101 | 001010110 |
| 10010110 | 111000011 | 10110110 | 001010011 |
| 10010111 | 111000111 | 10110111 | 001010111 |
| 10011000 | 111001000 | 10111000 | 001001000 |
| 10011001 | 111001100 | 10111001 | 001001100 |
| 10011010 | 111001001 | 10111010 | 001001001 |
| 10011011 | 111001101 | 10111011 | 001001101 |
| 10011100 | 101110010 | 10111100 | 001011000 |
| 10011101 | 101111000 | 10111101 | 001011100 |
| 10011110 | 111010010 | 10111110 | 001011001 |
| 10011111 | 111011000 | 10111111 | 001011101 |

TABLE 3d

Rate-8/9 (G = 4, I = 6) precoderless code table (data words 193–256)

| INPUT | OUTPUT | INPUT | OUTPUT |
|---|---|---|---|
| 11000000 | 011100010 | 11100000 | 110100010 |
| 11000001 | 011100110 | 11100001 | 110100110 |
| 11000010 | 011100011 | 11100010 | 110100011 |
| 11000011 | 011100111 | 11100011 | 110100111 |
| 11000100 | 011110010 | 11100100 | 110110010 |
| 11000101 | 011110110 | 11100101 | 110110110 |
| 11000110 | 011110011 | 11100110 | 110110011 |
| 11000111 | 011110111 | 11100111 | 110110111 |
| 11001000 | 011101000 | 11101000 | 110101000 |
| 11001001 | 011101100 | 11101001 | 110101100 |
| 11001010 | 011101001 | 11101010 | 110101001 |
| 11001011 | 011101101 | 11101011 | 110101101 |
| 11001100 | 011111000 | 11101100 | 110111000 |
| 11001101 | 011111100 | 11101101 | 110111100 |
| 11001110 | 011111001 | 11101110 | 110111001 |
| 11001111 | 011111101 | 11101111 | 110111101 |
| 11010000 | 100000010 | 11110000 | 101110001 |
| 11010001 | 100000110 | 11110001 | 101111001 |
| 11010010 | 100000011 | 11110010 | 111010001 |
| 11010011 | 100000111 | 11110011 | 111011001 |
| 11010100 | 100010010 | 11110100 | 101110011 |
| 11010101 | 100010110 | 11110101 | 101111011 |
| 11010110 | 100010011 | 11110110 | 111010011 |
| 11010111 | 100010111 | 11110111 | 111011011 |
| 11011000 | 100001000 | 11111000 | 101110100 |
| 11011001 | 100001100 | 11111001 | 101111100 |
| 11011010 | 100001001 | 11111010 | 111010100 |
| 11011011 | 100001101 | 11111011 | 111011100 |
| 11011100 | 100011000 | 11111100 | 101110110 |
| 11011101 | 100011100 | 11111101 | 101111110 |
| 11011110 | 100011001 | 11111110 | 111010110 |
| 11011111 | 100011101 | 11111111 | 111011110 |

What is claimed is:

1. A bit encoding method comprising,
  (a) partitioning the input bit stream into a first group of bits and a second group of bits;
  (b). via a finite state machine, converting input bits into output bits in which the number of alternating output bits is limited to j+1 where j is a predefined maximum number of transitions in the output bits, in which the number of like output bits is limited to k+1 where k is a predefined maximum number of non-transitions in the output bits, and the number of like output bits is at least d+1 and at most k+1 where d is a predefined minimum number of non-transitions in the output bits and k is a predefined maximum number of non-transitions in the output bits; and
  (c). generating a parity code in dependence on the second group of bits and the coded output bits.

2. A method as claimed in claim 1, comprising converting subgroups of the first group of bits into coded output bits, and interleaving the subgroups of the first group of bits with subgroups of the second group of bits.

3. Encoding apparatus for converting an input bit stream into an output bit stream, the apparatus comprising:
  a. partitioning logic for partitioning the input bit stream into a first group of bits and a second group of bits;
  b. a plurality of modulation encoders, each modulation encoder comprising a finite state machine for converting a subgroup of input bits into coded output bits in which the number of alternating output bits is limited to j+1 where j is a predefined maximum number of transitions in the output bits, and in which the number of like output bits is limited to k+1 where k is a predefined maximum number of non-transitions in the output bits, said modulation encoder connected to the partitioning logic for converting the first group of bits into coded output bits;
  c. a parity generator connected to each modulation encoder and the partitioning logic for generating a parity code in dependence on the second group of bits and the coded output bits; and
  d. combining logic connected to modulation encoder and the partitioning logic and comprising a parallel to serial convertor connected to each modulation encoder and the partitioning logic for combining the coded output bits and the second group of bits to generate the output bit stream wherein the subgroups of the first group of bits are interleaved with subgroups of the second group of bits.

4. The modulation encoder of claim 3 having a finite state machine for converting input bits into output bits in which the number of like output bits is at least d+1 and at most k+1 where d is a predefined minimum number of non-transitions in the output bits and k is a predefined maximum number of non-transitions in the output bits.

5. Decoding apparatus for decoding an input bit stream into an output bit stream, the apparatus comprising:

a. partitioning logic for partitioning the input stream into a first group of bits and a second group of bits, said partitioning logic comprising a serial to parallel convertor;

b. a plurality of modulation decoders, each modulation decoder receiving input bits from the partitioning logic, each modulation decoder having sliding block decoder logic for recovering output bits from input bits in which the number of alternating input bits is limited to j+1 where j is a predefined maximum number of transitions in the input bits, and in which the number of like input bits is limited to k+1 where k is a predefined maximum number of non-transitions in the input bits, each of said modulation decoders connected to the partitioning logic, each of said modulation decoders decoding the first group of bits into decoded output bits; and c. combining logic connected to each modulation decoder and the partitioning logic for combining the second group of bits and the decoded output bits.

6. The modulation decoder of claim 5 having sliding block decoder logic for recovering output bits from input bits in which the number of like input bits is at least d+1 and at most k+1 where d is a predefined minimum number of non-transitions in the input bits and k is a predefined maximum number of non-transitions in the input bits.

7. Apparatus as claimed in claim 5, comprising a plurality of modulation decoders each of said modulation decoders converting a subgroup of the first group of bits into decoded output bits, wherein other subgroups of the first group of bits are interleaved with subgroups of the second group of bits.

* * * * *